(12) United States Patent
Juestel et al.

(10) Patent No.: US 7,544,309 B2
(45) Date of Patent: Jun. 9, 2009

(54) ILLUMINATION SYSTEM COMPRISING A RADIATION SOURCE AND A FLUORESCENT MATERIAL

(75) Inventors: Thomas Juestel, Aachen (DE); Peter Schmidt, Aachen (DE); Henning Hoeppe, Kirchanschoering (DE); Wolfgang Schnick, Gauting (DE); Walter Mayr, Alsdorf (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 489 days.

(21) Appl. No.: 10/538,203
(22) PCT Filed: Dec. 4, 2003
(86) PCT No.: PCT/IB03/05727

§ 371 (c)(1),
(2), (4) Date: Jun. 9, 2005

(87) PCT Pub. No.: WO2004/055910
PCT Pub. Date: Jul. 1, 2004

(65) Prior Publication Data
US 2006/0022146 A1 Feb. 2, 2006

(30) Foreign Application Priority Data
Dec. 13, 2002 (EP) .................................. 02102752

(51) Int. Cl.
C09K 11/08 (2006.01)
C09K 11/66 (2006.01)
C09K 11/02 (2006.01)
C09K 11/77 (2006.01)
H01L 23/58 (2006.01)
H01L 29/18 (2006.01)
H01J 1/62 (2006.01)
H01J 63/04 (2006.01)

(52) U.S. Cl. .................. 252/301.4 F; 252/301.4 R; 257/88; 313/503

(58) Field of Classification Search ........... 252/301.4 F, 252/301.4 R; 257/48, 88; 313/503
See application file for complete search history.

(56) References Cited

U.S. PATENT DOCUMENTS 5,951,915 A * 9/1999 Hase et al. ............ 252/301.4 F (Continued)

FOREIGN PATENT DOCUMENTS

WO    WO 00/33390    6/2000

(Continued)

OTHER PUBLICATIONS de Graaf et al. "Long wavelength Eu2+ emission in Eu-doped Y-Si-Al-O-N glasses". Journal of the European Ceramic Society. vol. 23, Issue 7, Jun. 2003, pp. 1093-1097. Received Aug. 30, 2001; revised Jun. 25, 2002; accepted Jul. 6, 2002. ; Available online Sep. 18, 2002.*

*Primary Examiner*—Karl E Group
*Assistant Examiner*—Noah S Wiese

(57) ABSTRACT

The invention is concerned with an illumination system, comprising a radiation source and a fluorescent material comprising at least one phosphor capable of absorbing a part of light emitted by the radiation source and emitting light of wavelength different from that of the absorbed light; wherein said at least one phosphor is an oxido-nitrido-silicate of general formula $EA_{2-z}Si_{5-a}B_aN_{8-a}O_a:Ln_z$, wherein $0<z\leq 1$ and $0<a<5$; comprising at least one element EA selected from the group consisting of Mg, Ca, Sr, Ba and Zn and at least one element B selected from the group consisting of Al, Ga and In, and being activated by a lanthanide selected from the group consisting of cerium, europium, terbium, praseodymium and mixtures thereof. The invention is also concerned with a phosphor, which is an oxido-nitrido-silicate of the general formula $EA_{2-z}Si_{5-a}B_aN_{8-a}O_a:Ln_z$, wherein $0<z\leq 1$ and $0<a<5$; comprising at least one element EA selected from the group consisting of Mg, Ca, Sr, Ba and Zn and at least one element B selected from the group consisting of Al, Ga and In, and being activated by a lanthanide selected from the group consisting of cerium, europium, terbium and mixtures thereof.

13 Claims, 3 Drawing Sheets

U.S. PATENT DOCUMENTS

| | | | |
|---|---|---|---|
| 5,998,925 A | 12/1999 | Shimizu et al. | |
| 6,139,774 A * | 10/2000 | Yamada et al. | 252/301.4 F |
| 2002/0043926 A1 | 4/2002 | Takahashi et al. | |
| 2003/0052595 A1* | 3/2003 | Ellens et al. | 313/501 |
| 2003/0094893 A1* | 5/2003 | Ellens et al. | 313/503 |
| 2006/0033081 A1* | 2/2006 | Hintzen et al. | 252/301.4 F |

FOREIGN PATENT DOCUMENTS

| | | |
|---|---|---|
| WO | WO 0033390 | 7/2000 |
| WO | WO-0124229 A3 * | 4/2001 |

* cited by examiner

ILLUMINATION SYSTEM COMPRISING A RADIATION SOURCE AND A FLUORESCENT MATERIAL

The present invention generally relates to an illumination system comprising a radiation source and a fluorescent material comprising a phosphor. The invention also relates to a phosphor for use in such illumination system.

More particularly, the invention relates to an illumination system and fluorescent material comprising a phosphor for the generation of specific, colored light, including white light, by luminescent down conversion and additive color mixing based on a ultraviolet or blue radiation emitting radiation source. A light-emitting diode as a radiation source is especially contemplated.

Recently, various attempts have been made to make white light emitting illumination systems by using light emitting diodes as radiation sources. When generating white light with an arrangement of red, green and blue light emitting diodes, there has been such a problem that white light of the desired tone cannot be generated due to variations in the tone, luminance and other factors of the light emitting diodes.

In order to solve these problems, there have been previously developed various illumination systems, which convert the color of light, which is emitted by light emitting diodes, by means of a fluorescent material comprising a phosphor to provide a visible white light illumination.

U.S. Pat. No. 5 998 925 discloses a white light emitting LED device. It uses yttrium aluminum garnet doped with cerium, Y3Al5O12:Ce, to convert blue emission of an InGaN-diode into yellow to produce white light of suitable color temperature. Another approach according to WO 00/33390 uses a combination of a blue emitting LED together with a green and red phosphor. The phosphors are at least one of a first phosphor, among others thiogallates (Sr,Ca,Ba)(Al,Ga)2S4:Eu, and at least one of a second phosphor, among others metal sulfide SrS:Eu, or (Ca,Sr)S:Eu, or thiogallate CaLa2S4:Ce, to produce white light of distinct color temperature. The thiogallate (SrCa,Ba)(Al,Ga)2S4:Eu can be used to generate specific colors together with light emitting elements such as blue LEDs.

The above mentioned phosphors can be used to produce white light with various color temperatures and suitable index of color rendering by luminescent down conversion of primary LED emission, but they exhibit several drawbacks related to total conversion efficiency, absorption strength, emission wavelength tunability, thermal quenching characteristics and life time which are of high importance for using these phosphors in LEDs.

Especially when a light emitting diode having a high-energy band gap is used to improve the conversion efficiency of the phosphor material, then energy of light emitted by the semiconductor is increased. The number of photons having energies above a threshold, which can be absorbed by the phosphor material, increases, resulting in more light being absorbed and the efficiency being increased. But also the energy absorbed by the fluorescent material inevitably increases, resulting in more significant degradation of the fluorescent material. Use of the light emitting diode with higher intensity of light emission for an extended period of time causes further more significant degradation of the fluorescent material.

Also the fluorescent material provided in the vicinity of the light-emitting component may be exposed to a high temperature such as rising temperature of the light emitting component and heat transmitted from the external environment.

Further, some fluorescent materials are subject to accelerated deterioration due to combination of moisture entered from the outside or introduced during the production process, the light and heat transmitted from the light emitting diode.

By US 2002/0043926 A1 there is provided a light-emitting unit which comprises:

a light-emitting device for emitting light with a wavelength range of from 360 nm to 550 nm; and a fluorescent material made of Ca—Al—SiO—N oxynitride glass activated with $Eu^{2+}$; wherein a part of light emitted from the light emitting device is emitted outward after it is subjected to wavelength conversion by the fluorescent material.

Still there is an ongoing need to generate new phosphor compositions to improve efficiency and color quality in luminescent devices, particularly in the production of white light.

Thus the present invention provides an illumination system, comprising a radiation source and a fluorescent material comprising at least one phosphor capable of absorbing a part of light emitted by the radiation source and emitting light of wavelength different from that of the absorbed light; wherein said at least one phosphor is an oxido-nitrido-silicate of general formula

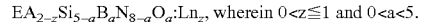

$EA_{2-z}Si_{5-a}B_aN_{8-a}O_a:Ln_z$, wherein $0<z\leq1$ and $0<a<5$.

comprising at least one element EA selected from the group consisting of Mg, Ca, Sr, Ba and Zn and at least one element B selected from the group consisting of Al, Ga and In, and, being activated with a lanthanide selected from the group consisting of cerium, europium, terbium, praseodymium and mixtures thereof.

This type of phosphor emits in the red spectral range of the visible spectrum and thus can provide the red component in LEDs emitting specific colors or white light. Total conversion efficiency can be up to 90%. Additional important characteristics of the phosphors include 1) resistance to thermal quenching of luminescence at typical device operating temperatures (e.g. 80° C.); 2) lack of interfering reactivity with the encapsulating resins used in the device fabrication; 3) suitable absorptive profiles to minimize dead absorption within the visible spectrum; 4) a temporally stable luminous output over the operating lifetime of the device and; 5) compositionally controlled tuning of the phosphors excitation and emission properties.

Another aspect of the present invention provides an illumination system wherein the fluorescent material comprises a phosphor of general formula $EA_{2-z}Si_{5-a}B_aN_{8-a}O_a:Ln_z$, wherein $0<z\leq1$ and $0<a<5$ comprising at least one element EA selected from the group consisting of Mg, Ca, Sr, Ba and Zn and at least one element B selected from the group consisting of Al, Ga and In, and being activated with an lanthanide selected from the group consisting of cerium, europium, terbium and mixtures thereof and a yellow or green phosphor.

Preferably the yellow or green phosphor is selected of the group of MS:Eu,Ce,Cu comprising at least one element selected from the group M=Mg, Ca, Sr, and Zn;

$MN_2S_4$:Eu,Ce comprising of at least one element selected from the group M=Mg, Ca, Sr, and Zn at least one element selected from the group N=Al, Ga, In, Y, La, Gd, $(Re_{1-r}Sm_r)_3(Al_{1-s}Ga_s)_5O_{12}$:Ce, where $0\leq r<1$ and $0\leq s\leq1$ and Re selected from Y, Lu, Sc, La and Gd and $(Ba_{1-x-y-z}Sr_xCa_y)_2SiO_4:Eu_z$, wherein $0\leq x\leq1$, $0\leq y\leq1$ and $0<z<1$ The emission spectrum of such a fluorescent material has the appropriate wavelengths to obtain together with the blue light of the LED a high quality white light with good color rendering at the required color temperature.

Preferably the fluorescent material of the illumination system comprises a phosphor of general formula

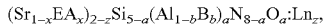

wherein $0<a<5$, $0<b\leq1$, $0<x\leq1$ and $0<z\leq1$

Especially preferred are Eu(II) activated oxido-nitrido-silicate comprising an element EA selected from the earth alkaline metals Sr alone or in combination with Ca and Ba and metal B selected as Al according to general formula $(Sr_{1-x-y}Ba_xCa_y)_{2-z}Si_{5-a}Al_aN_{8-a}O_a:Eu_z$ wherein $0<a<5$, $0<x\leq1$, $0\leq y\leq1$. and $0<z\leq1$.

In particular, the invention relates to specific phosphor composition $Sr_{1.96}Si_3Al_2N_6O_2:Eu_{0.04}$ which exhibit a high quantum efficiency of 80-90%, high absorbance in the range from 370 nm to 470 nm of 60-80% and low loss, below 10%, of the luminescent lumen output from room temperature to 100° C. due to thermal quenching.

The invention is also concerned with a phosphor capable of absorbing a part of light emitted by the radiation source and emitting light of wavelength different from that of the absorbed light; wherein said at least one phosphor is an oxido-nitrido-silicate of general formula $EA_{2-z}Si_{5-a}B_aN_{8-a}O_a:Ln_z$, wherein $0<z\leq1$ and $0<a<5$.

comprising at least one element EA selected from the group consisting of Mg, Ca, Sr, Ba and Zn and at least one element B selected from the group consisting of Al, Ga and In, and being activated with a lanthanide selected from the group consisting of cerium, europium, terbium and mixtures thereof.

DETAILED DESCRIPTION

Figure 1:
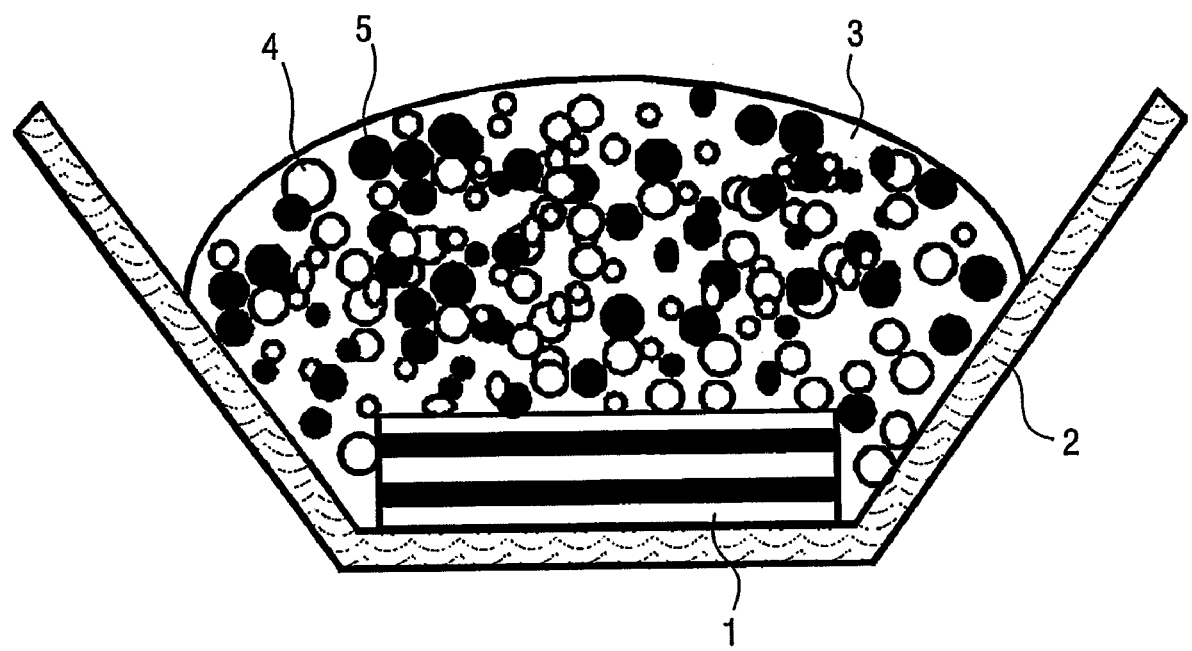
FIG. 1 shows a schematic view of a tri-color white LED lamp comprising a two-phosphor mixture of $Sr_{1.96}Si_3Al_2N_6O_2:Eu_{0.04}$ and $Sr\,Ga_2S_4:Eu$ positioned in a pathway of light emitted by an LED structure.

The present invention focuses on a lanthanide-activated oxido-nitrido-silicate as a phosphor in any configuration of an illumination system containing a radiation source, including, but not limited to discharge lamps, fluorescent lamps, LEDs, and LDs. While the use of the present phosphor is contemplated for a wide array of lighting, the present invention is described with particular reference to and finds particular application to LEDs. As used herein, the term "light" encompasses radiation in the UV, IR and visible regions of the electromagnetic spectrum.

The fluorescent material according to the invention comprises as a phosphor a lanthanide activated oxido-nitrido-silicate comprising an element EA selected from the earth alkaline metals Mg, Ca, Sr, Ba and from zinc and at least one additional metal B selected from the group of Al, Ga and In.

The phosphor conforms to the general formula $EA_{2-z}Si_{5-a}B_aN_{8-a}O_a:Ln_z$, wherein $0<z\leq1$ and $0<a<5$.

The term "phosphor" is used throughout this specification and the appended claims in its conventional meaning, to mean a luminescent material that can absorb an excitation energy (usually radiation energy) and store this energy for a period of time. The stored energy is then emitted as radiation of a different energy than the initial excitation energy. For example, "down-conversion" refers to a situation where the emitted radiation has less quantum energy than the initial excitation radiation. Thus, the energy wavelength effectively increases, and this increase is termed a "Stokes shift". "Up-conversion" refers to a situation where the emitted radiation has greater quantum energy than the excitation radiation ("Anti-Stokes shift").

The term "activator" is used herein to mean a substance incorporated in a phosphor as an activator or luminescent center, either substitutionally or interstitially with respect to the crystal lattice of the host substance, or even adsorbed on a surface of the crystal lattice of the host substance. The term "activator" can also include co-activators used, for example, to facilitate energy transfer.

The activators play a decisive role due to the composition dependent crystal field dependence of absorption, emission and conversion behavior of the optical 4f-5d transitions of the emitting centers.

The lanthanide activator of the present invention is chosen from the group consisting of cerium, europium, terbium, praseodymium and mixtures thereof. The preferred lanthanide, or mixtures thereof, is chosen to correspond to the emission wavelengths desired in the light-emitting device.

The choice of the lanthanide activator of the phosphor determines the emission wavelength of the phosphor. For example, when the exciting radiation is in the UV range and lanthanide Ln is europium(II), the peak in the emission spectrum is typically of longer wavelength (580-660 nm), and appears red. When the exciting radiation is in the UV range and lanthanide is terbium (III), the peak in the emission spectrum is typically of shorter wavelength, and appears green. When the exciting radiation is in the UV range and the lanthanide is cerium (III), the peak in the emission spectrum may be of even shorter wavelength, and appear blue. It is therefore apparent that by choosing the correct lanthanide component in the present inventive phosphor, UV radiation from a LED can be converted to different visible colors.

The physical properties of the phosphor, such as the location and shape of the absorption spectrum can also be manipulated by the choice of the EA metals, their relative amounts and the amount of B metals and their relative amount The metal EA is chosen from the group including, but not limited to Mg, Ca, Sr, Ba and Zn.

The physical properties of the present phosphor may also be varied by the choice of the amount of substitution of silicon by metal B in the host lattice. The metal B is chosen from the group including, but not limited to Al, Ga and In.

In addition, silicon may alternatively be substituted by germanium.

The incorporation of oxygen into the nitridosilicate lattice of the known phosphors such as $EA_2Si_5N_8$:Eu decreases the proportion of covalent bond and ligand field splitting with respect to the activator cation. As a consequence this leads to a shift of excitation and emission bands to shorter wavelengths in comparison to nitridosilicate lattices.

Preferred examples of this class of phosphors are

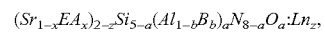

wherein $0<a<5$, $0<b\leq1$, $0<x\leq1$ and $0<z\leq1$

Especially preferred are Eu(II) activated oxido-nitrido-silicate comprising an element EA selected from the earth alkaline metals Sr alone or in combination with Ca and Ba and metal B selected as Al according to general formula $(Sr_{1-x-y}Ba_xCa_y)_{2-z}Si_{5-a}Al_aN_{8-a}O_a:Eu_z$ wherein $0<a<5$, $0<x\leq1$, $0\leq y\leq1$ and $0<z\leq1$.

In particular, the invention relates to specific phosphor composition $Sr_{1.96}Si_3Al_2N_6O_2:Eu_{0.04}$ which exhibit a high quantum efficiency of 80-90%, high absorbance in the range from 370 nm to 470 nm of 60-80% and low loss, below 10%, of the luminescent lumen output from room temperature to 100° C. due to thermal quenching.

$Sr_{1.96}Si_3Al_2N_6O_2:Eu_{0.04}$ emits in the red spectral range of the visible spectrum and thus can provide the red component in LEDs emitting specific colors or even white light.

Many other examples of suitable phosphors which adhere to the general formula $EA_{2-z}Si_{5-a}B_aN_{8-a}O_a:Ln_z$, wherein $0<z\leq1$ and $0<a<5$ are contemplated and will be obvious to the skilled artisan.

The above list is intended to be illustrative and should not be construed to be limiting in any way.

These red to yellow-red emitting phosphors are prepared by the following technique: To prepare the mixed oxides high purity nitrates, carbonates, oxalates and acetates of the earth alkaline metals or zinc and the lanthanides were dissolved with stirring in 25-30 ml deionized water. The solutions are stirred with heating on a hot-plate until the water has evaporated resulting in a white or yellow paste, depending on composition.

The solids are dried overnight (12 hours) at 120° C. The resulting solid is finely ground and placed into a high purity alumina crucible. The crucibles are loaded into a charcoal-containing basin and then into a tube furnace and purged with flowing nitrogen/hydrogen for several hours. The furnace parameters are 10° C./min to 1300° C., followed by a 4 hour dwell at 1300° C. after which the furnace is turned off and allowed to cool to room temperature.

These metal oxides are mixed with silicon nitride $Si_3N_4$ and the nitrides of the B-Metals such as AlN in predetermined ratios.

The powder mixture is placed into a high purity alumina crucible. The crucibles are loaded into a charcoal-containing basin and then into a tube furnace and purged with flowing nitrogen/hydrogen for several hours. The furnace parameters are 10° C./min to 1600° C., followed by a 4 hour dwell at 1600° C. after which the furnace is slowly cooled to room temperature.

The samples are once again finely ground before a second annealing step at 1600° C. is performed.

Luminous output may be improved through an additional third anneal at slightly lower temperatures in flowing argon.

The phosphor prepared by such method according to the general formula $EA_2Si_3Al_2N_6O_2:Eu$ comprises a host lattice with the main components of Si, N and Al. It may also comprise traces of F, Cl, H, C and O. The host lattice has a structure consisting of (N—Si—N—Al—N)-units in a three-dimensional network, wherein silicon as well as aluminum are tetrahedrically surrounded by nitrogen and oxygen.

Within the three dimensional network alkaline earth ions such as calcium, strontium, barium, magnesium and zinc as well as europium(II) are incorporated.

Figure 2:
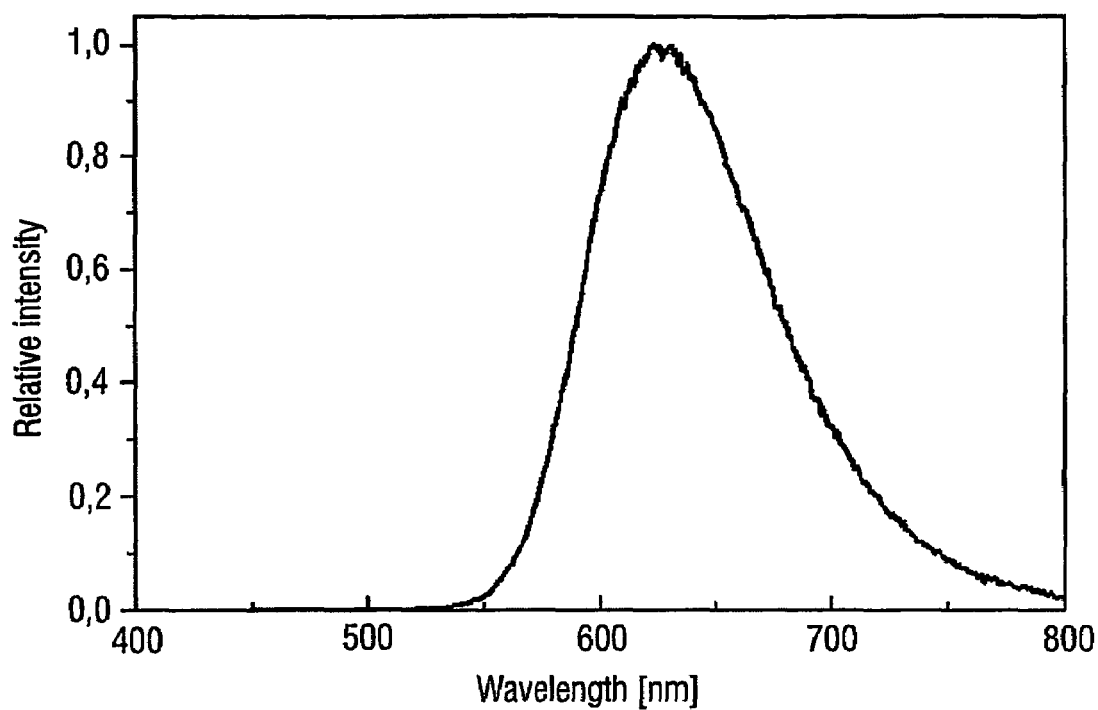
FIG. 2 discloses the X-ray diffraction diagram of $Sr_{1.96}Si_3Al_2N_6O_2:Eu_{0.04}$.

X-ray diffraction of $Sr_{1.96}Si_3Al_2N_6O_2:Eu_{0.04}$ as shown in FIG. 2 is consistent with the x-ray diffraction of $Sr_2Si_5N_8$ [T. Slieper, W. Milius, W. Schnick, Z. Anorg. Allg. Chem. 621 (1995) 1380] with certain small deviations of position and intensity due to the substitution of divalent metal ions and europium for strontium, aluminum for silicon and oxygen for nitrogen.

Figure 3:
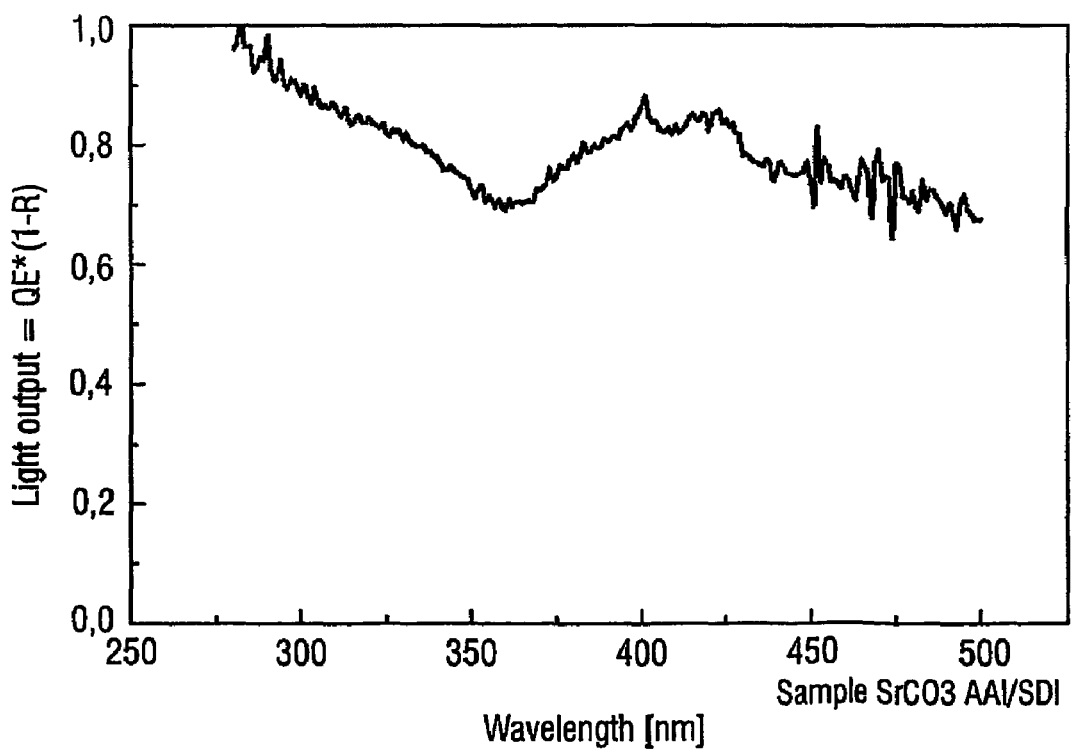
FIG. 3 discloses an emission spectrum of $Sr_{1.96}Si_3Al_2N_6O_2:Eu_{0.04}$ upon excitation by a blue LED at 460 nm.
Figure 4:
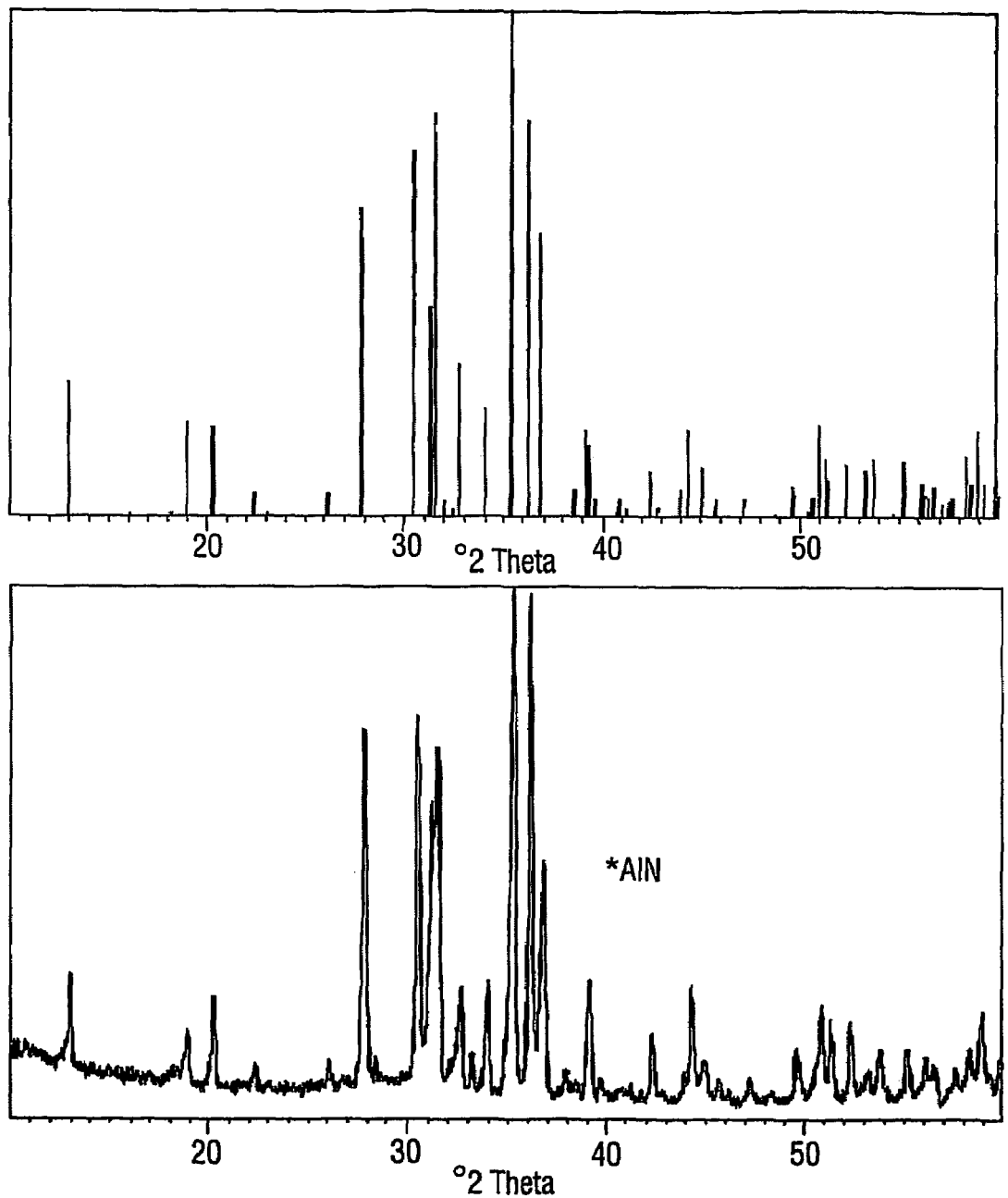
FIG. 4 discloses an excitation spectrum of $Sr_{1.96}Si_3Al_2N_6O_2:Eu_{0.04}$ upon excitation by a blue LED at 460 nm.

In an exemplary embodiment, the physical characteristics of the red phosphor $Sr_{1.96}Si_3Al_2N_6O_2:Eu_{0.04}$ are described by FIGS. 2 and 3. FIG. 2 is the excitation spectrum of the noted red phosphor and is a measurement of the relative intensity of the red emission versus excitation wavelength, while the red emission is measured at a constant wavelength. FIG. 3 is the emission spectra of the noted red phosphor and is a measurement of the relative intensity of emitted light at various wavelengths while the excitation is held constant.

In FIG. 3 it can be seen that when the emission intensity of the phosphor at 615 nm is measured, it is most intense when excited by radiation in the range of about 300-450 nm, which is in the near-UV to blue range of the electromagnetic radiation spectrum. FIG. 2 shows that when the excitation of the phosphor is held constant at 450 nm (the sample is excited only by radiation at 450 nm), the emission wavelength of the phosphor is strongest in the range of about 605-630 nm, which is perceived as red by the eye.

The invention also concerns an illumination system comprising a radiation source and a fluorescent material comprising at least one phosphor of general formula $EA_{2-z}Si_{5-a}B_aN_{8-a}O_a:Ln_z$ with addition of other well-known phosphors, which can be combined to achieve a specific color or white light when irradiated by a LED emitting primary UV or blue light as specified above.

Accordingly, the phosphors may be mixed or blended to produce desired colors. It is generally known that phosphor powders do not interact as a result of lamp maling and they exhibit the beneficial property that their spectra are cumulative in nature. Hence, the spectrum of an illumination system that includes a blend of phosphors will be a linear combination of the spectra of the radiation source and the individual phosphors. For example, if a red phosphor of the present invention, $Sr_{1.96}Si_3Al_2N_6O_2:Eu_{0.04}$ were mixed with any blue phosphor the light produced would appear purple to the eye.

Exemplary embodiments of the present invention include an UV- or blue LED and a fluorescent material comprising at least two phosphors which together produce white light having pleasing characteristics. Preferably green and red phosphors are selected so that they are excited by the blue-emitting LED. The red phosphor is chosen to be $Sr_{1.96}Si_3Al_2N_6O_2:Eu_{0.04}$ The green to yellow color-emitting phosphor typically has an emission peak at 510-560 nm with a full width at half maximum of not more than 60.

Said at least one other green to yellow color-emitting phosphor may comprise a photoluminescent metal sulfide MS comprising at least one element selected from the group M=Ba, Mg, and Zn alone or in combination with at least one of Sr, Ca; the sulfide being activated with europium, cerium or copper.

Said at least one other phosphor may also comprise at least one green phosphor comprising a complex metal thiometallate photoluminescent material MN2S4 comprised of at least one element selected from the group M=Mg, Zn, alone or in combination with at least one of Ba, Sr, Ca, and at least one element selected from the group N=Al, Ga, alone or in combination with In, Y, La, Gd, the thiogallate being activated with at least one of europium (Eu) and cerium (Ce).

Said at least one phosphor may also comprise at least one green phosphor comprising garnet fluorescent material represented by a general formula $(Re_{1-r}Sm_r)_3(Al_{1-s}Ga_s)_5O_{12}:Ce$, where $0\leq r<1$ and $0\leq s\leq1$ and Re is at least one selected from Y, Lu, Sc, La and Gd, activated with cerium.

Said at least one phosphor may also comprise at least one green phosphor comprising silicate fluorescent material represented by a general formula $(Ba_{1-x-y-z}Sr_xCa_y)_2SiO_4:Eu_z$, wherein $0 \leq x \leq 1$, $0 \leq y \leq 1$ and $0 < z < 1$, activated by europium.

Radiation sources suited to use in the present invention include but are not limited to GaN-based (InAlGaN) semiconductor devices. Suitable GaN semiconductor materials for forming the light emitting components are generally represented by the general formula $In_IGa_JAl_KN$, where I, J, and K are greater than or equal to zero, and $I+J+K=1$. The nitride semiconductor materials may thus include materials such as InGaN and GaN, and may be doped with various impurities, for example, for improving the intensity or adjusting the color of the emitted light.

While the invention is described with particular reference to UV/blue light emitting components, it should be appreciated that light emitting components which emit light of a different region in the electromagnetic spectrum may also be used. For example, a red-emitting LED or LD, such as an aluminum indium gallium phosphide (AlInGaP) LED would also be applicable.

Electroluminescent radiation sources include semiconductor optical radiation emitters and other devices that emit optical radiation in response to electrical excitation. Semiconductor optical radiation emitters include light emitting diode LED chips, light emitting polymers (LEPs), organic light emitting devices (OLEDs), polymer light emitting devices (PLEDs), etc.

Moreover, light emitting components such as those found in discharge lamps and fluorescent lamps, such as mercury low and high pressure discharge lamps, sulfur discharge lamps, and discharge lamps based an molecular radiators are also contemplated for use as radiation sources with the present inventive phosphor compositions.

Any configuration of an illumination system which includes a light emitting diode as a radiation source and a phosphor composition is contemplated in the present invention. In an exemplary embodiment, the phosphor is located adjacent to the LED. In another embodiment, the phosphor is situated between encapsulant layers and is not in direct contact with the LED. In yet another embodiment, the phosphor is dispersed throughout an encapsulating layer. Notwithstanding these described configurations, the skilled artisan will recognize that any LED configuration may be improved by the inclusion of the present inventive phosphor.

A detailed construction of such light-emitting device is shown in FIG. 1.

FIG. 1 shows a schematic view of the device of the present invention. The device comprises LED 1. LED 1 is positioned in a reflector cup 2. LED 1 emits light in a pattern. A phosphor composition 4,5 is positioned in the pattern. The phosphor composition is embedded in a resin 3. In this example, reflector cup 2 can modify light pattern if light is reflected into a space not previously covered by the initial light pattern (e.g. in the case of a parabolic reflector). It is understood that one of ordinary skill in the art can provide reflector cup 2 in any shape that optimizes reflection of light back to phosphor composition 4,5, or optimizes positioning of LED 1 to provide a light pattern for efficient conversion. For example, the walls of reflector cup 2 can be parabolic.

In one embodiment, the device further comprises a polymer for encapsulating the phosphor or phosphor blend. In this embodiment, the phosphor or phosphor blend should exhibit high stability properties in the encapsulant. Preferably, the polymer is optically clear to prevent significant light scattering. In one embodiment, the polymer is selected from the group consisting of epoxy and silicone resins. A variety of polymers are known in the LED industry for making 5 mm LED lamps. Adding the phosphor mixture to a liquid that is a polymer precursor can perform encapsulation. For example, the phosphor mixture can be a powder. Introducing phosphor particles into polymer precursor liquid results in formation of a slurry (i.e. a suspension of particles). Upon polymerization, the phosphor mixture is fixed rigidly in place by the encapsulation. In one embodiment, both the composition and the LED are encapsulated in the polymer.

The use of a phosphor capable of absorbing a part of light emitted by the radiation source and emitting light of wavelength different from that of the absorbed light; wherein said at least one phosphor is an oxido-nitrido-silicate of general formula

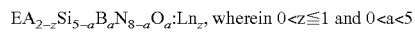
$EA_{2-z}Si_{5-a}B_aN_{8-a}O_a:Ln_z$, wherein $0 < z \leq 1$ and $0 < a < 5$ comprising at least one element EA selected from the group consisting of Mg, Ca, Sr, Ba and Zn and at least one element B selected from the group consisting of Al, Ga and In, and being activated with a lanthanide selected from the group consisting of cerium, europium, terbium, praseodymium and mixtures thereof is especially advantageous if the phosphor composition is applied as a thin film or in a small volume, because they are not sensitive to higher temperatures, which result in thin layers due to heat generated by the Stokes shift together with strong absorption and consequently very small light penetration depth.

The phosphor comprising fluorescent material may be fabricated by eventually dry blending phosphors in a suitable blender and then assign to a liquid suspension medium or the individual phosphor or phosphors may be added to a liquid suspension, such as the nitrocellulose/butyl acetate binder and solvent solution used in commercial lacquers. Many other liquids including water with a suitable dispersant and thickener or binder such as polyethylene oxide can be used. The phosphor containing composition is painted or coated or otherwise applied on the LED and dried.

Otherwise the phosphor or phosphors can be combined with a suitable polymer system, such as polypropylene, polycarbonate, or polytetrafluoroethylene, to a phosphor composition, which is then coated or applied to the LED and dried, solidifies, hardeners, or cured. The liquid polymer system may optionally be UV cured or room temperature cured to minimize any heat damage to the LED.

Otherwise a clear polymer lens made of suitable plastic such as polycarbonate or other rigid transparent plastic is molded over the LED. Lens may be further coated with anti-reflective layers to facilitate light to escape the device.

Although the role of phosphor grain size (mean diameter of phosphor particles) is not completely understood, weight fractions may change depending on a particular grain size. Preferably, grain sizes are less than 15 μm, and more preferably, less than 12 μm, to avoid clogging of devices which dispose the phosphors. In one embodiment, the grain size of each phosphor type varies. In certain specific embodiments, the grain size of The phosphor is less than about 10 μm. Other devices, however, can be prepared with larger grain sizes.

Although unabsorbed light emitted from the LED contributes to color rendering, unabsorbed light can sometimes escape without mixing with light emitted from the phosphors, resulting in a reduced overall efficiency of the device. Thus, in one embodiment, the LED and composition are positioned within a reflector cup. A reflector cup can be any depression or recess prepared from a reflecting material. By positioning the LED and phosphor particles in a reflector cup, unabsorbed/unmixed LED-emitted light can be reflected either back to the phosphor particles to eventually be absorbed, or mixed with light emitted from the phosphors.

The function and advantage of these and other embodiments of the present invention will be more fully understood from the example below. The following example are intended to illustrate the benefits of the present invention, but do not exemplify the full scope of the invention.

EXAMPLE

For preparation of $Sr_{1.96}Si_3Al_2N_6O_2:Eu_{0.04}$ the starting materials 59.41 g (566.3 mmol) $Sr_{0.98}Eu_{0.02}O$, 27.18 g (663.1 mmol) AlN and 79.43 g (566.1 mmol) $Si_3N_4$ are thoroughly dry milled in an agate mortar. Afterwards the homogenized powder is annealed for 4 h at 1500° C. under nitrogen/hydrogen, whereby the crucible comprising the powder is put into a second, charcoal-containing crucible.

After an intermittent milling step, the powder is annealed for 4 h at 1600° C. under nitrogen/hydrogen again.

The resulting powder is milled on a roller bench for several hours. The milled powder has an average particle size of 3-5 μm. Its quantum efficiency is 90% and its lumen equivalent is 190 lm/W. The color point is at x=0.64, y =0.36.

For manufacturing a white illumination system based on a 460 nm emitting InGaN LED a phosphor blend comprising SrGa2S4:Eu and $Sr_{1.96}Si_3Al_2N_6O_2:Eu_{0.04}$ is suspended into a silicone precursor. A droplet of this suspension is deposited onto the LED Chip and subsequently polymerized. A plastic lens seals the LED.

For manufacturing a white illumination system based on a 460 nm emitting InGaN LED a phosphor blend comprising (Ba,Sr)2SiO4:Eu and $Sr_{1.96}Si_3Al_2N_6O_2:Eu_{0.04}$ is suspended into a silicone precursor. A droplet of this suspension is deposited onto the LED Chip and subsequently polymerized. A plastic lens seals the LED.

The invention claimed is:

1. An illumination system, comprising a radiation source and a fluorescent material comprising at least one phosphor capable of absorbing a part of light emitted by the radiation source and emitting visible light of wavelength different from that of the absorbed light; wherein said at least one phosphor is an oxido-nitrido-silicate of general formula $EA_{2-z}Si_{5-a}B_aN_{8-a}O_a:Ln_z$, wherein $0<z\leq 1$ and $0<a<5$, comprising at least one element EA selected from the group consisting of Mg, Ca, Ba and Zn and at least one element B selected from the group consisting of Ga and In, and being activated by a lanthanide selected from the group consisting of cerium, europium, terbium, praseodymium and mixtures thereof.

2. The illumination system according to claim 1, wherein the fluorescent material comprises a red phosphor having a general formula of $EA_{2-z}Si_{5-a}B_aN_{8-a}O_a:Ln_z$, wherein $0<z\leq 1$ and $0<a<5$ and a green or yellow phosphor.

3. The illumination system according to claim 1, further comprising a green or yellow phosphor selected from the group of
MS:Eu, Ce, Cu comprising at least one element selected from the group M=Mg, Ca, Sr, and Zn;
MN$_2$S$_4$:Eu, Ce comprising of at least one element selected from the group M=Mg, Ca, Sr, and Zn at least one element selected from the group N=Al, Ga, In, Y, La, Gd,
$(Re_{1-r}Sm_r)_3(Al_{1-s}Ga_s)_5O_{12}$:Ce, where $0\leq r<1$ and $0\leq s\leq 1$ and Re selected from Y, Lu, Sc, La and Gd
and $(Ba_{1-x-y-z}Sr_xCa_y)_2SiO_4:Eu_z$, wherein $0\leq x\leq 1$, $0\leq y\leq 1$ and $0<z<1$.

4. The illumination system according to claim 1, wherein said radiation source comprises a nitride compound semiconductor represented by the general formula $In_iGa_jAl_kN$, where $0\leq i\leq 1$, $0\leq j\leq 1$, $0\leq k\leq 1$ and $i+j+k=1$.

5. The illumination system according to claim 1, wherein the system is a traffic sign.

6. A phosphor capable of absorbing a part of light emitted by the radiation source and emitting visible light of wavelength different from that of the absorbed light;
wherein said at least one phosphor is an oxido-nitrido-silicate of general formula $EA_{2-z}Si_{5-a}B_aN_{8-a}O_a:Ln_z$, wherein $0<z\leq 1$ and $0<a<5$ comprising at least one element EA selected from the group consisting of Mg, Ca, Ba and Zn and at least one element B selected from the group consisting of Ga and In, and being activated with a lanthanide selected from the group consisting of cerium, europium, terbium and mixtures thereof.

7. A phosphor capable of absorbing a part of light emitted by the radiation source and emitting light of wavelength different from that of the absorbed light; wherein said at least one phosphor is of general formula $Sr_{1.96}Si_3Al_2N_6O_2:Eu_{0.04}$.

8. The phosphor according to claim 6, wherein silicon is substituted by germanium.

9. An illumination system comprising a radiation source and a fluorescent material comprising at least one phosphor capable of absorbing a part of light emitted by the radiation source and emitting visible light of wavelength different from that of the absorbed light; wherein said at least one phosphor is an oxido-nitrido-silicate of general formula $EA_{2-z}Si_{5-a}B_aN_{8-a}O_a:Ln_z$, wherein $0<z\leq 1$ and $0<a<5$ comprising at least one element EA selected from a group of Mg and Zn and at least one element B selected from a group of Ga and In, and being activated by a lanthanide selected from a group of cerium, terbium, praseodymium and mixtures thereof.

10. The illumination system of claim 9, wherein the fluorescent material comprises a red phosphor having a general formula of $EA_{2-z}Si_{5-a}B_aN_{8-a}O_a:Ln_z$, wherein $0<z\leq 1$ and $0<a<5$ and a green or yellow phosphor.

11. The illumination system of claim 10, wherein the green or yellow phosphor is selected from the group of
MS:Eu, Ce, Cu comprising at least one element selected from a group M=Mg, Ca, Sr, and Zn;
MN$_2$S$_4$:Eu, Ce comprising of at least one element selected from a group M=Mg, Ca, Sr, and Zn at least one element selected from a group N=Al, Ga, In, Y, La, Gd,
$(Re_{1-r}Sm_r)_3(Al_{1-s}Ga_s)_5O_{12}$:Ce, where $0\leq r<1$ and $0\leq s\leq 1$ and Re selected from Y, Lu, Sc, La and Gd
and $(Ba_{1-x-y-z}Sr_xCa_y)_2SiO_4:Eu_z$, wherein $0\leq x\leq 1$, $0\leq y\leq 1$ and $0<z<1$.

12. The illumination system of claim 9, wherein the radiation source comprises a nitride compound semiconductor represented by the general formula $In_iGa_jAl_kN$, where $0\leq i\leq 1$, $0\leq j\leq 1$, $0\leq k\leq 1$ and $i+j+k=1$.

13. The illumination system of claim 9, wherein the system is a traffic sign.

* * * * *